United States Patent
Miyashita et al.

(10) Patent No.: US 6,840,844 B2
(45) Date of Patent: Jan. 11, 2005

(54) PROCESS FOR PREPARING P-TYPE THERMOELECTRIC MATERIAL

(75) Inventors: Norihiko Miyashita, Ageo (JP); Tomoyasu Yano, Ageo (JP); Ryoma Tsukuda, Ageo (JP); Isamu Yashima, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 10/365,384

(22) Filed: Feb. 13, 2003

(65) Prior Publication Data

US 2003/0153248 A1 Aug. 14, 2003

(30) Foreign Application Priority Data

Feb. 14, 2002 (JP) ........................................ 2002-037249

(51) Int. Cl.$^7$ ................................................. B24B 1/00
(52) U.S. Cl. ............................. 451/51; 451/53; 451/54
(58) Field of Search ....................... 451/28, 41, 51–54, 451/56

(56) References Cited

U.S. PATENT DOCUMENTS

| | | | | | |
|---|---|---|---|---|---|
| 5,108,515 A | * | 4/1992 | Ohta et al. | ................... | 136/201 |
| 5,246,504 A | * | 9/1993 | Ohta et al. | ................... | 136/201 |
| 5,318,743 A | * | 6/1994 | Tokiai et al. | ................. | 419/38 |
| 6,403,875 B1 | * | 6/2002 | Karino et al. | ............... | 136/201 |

FOREIGN PATENT DOCUMENTS

| | | | |
|---|---|---|---|
| JP | 11-284237 A | 10/1999 |
| JP | 2001-196648 A | 7/2001 |
| JP | 2001-313426 A | 11/2001 |
| JP | 2001-313427 A | 11/2001 |

* cited by examiner

*Primary Examiner*—Eileen P. Morgan
(74) *Attorney, Agent, or Firm*—Sughrue Mion, PLLC

(57) ABSTRACT

A p-type thermoelectric material is prepared by mixing and melting at least two members selected from bismuth, tellurium, selenium, antimony, and sulfur to obtain an alloy ingot; grinding the alloy ingot to obtain powder of the allow mass; and hot pressing the powder. At least the hot pressing is carried out in the presence of any one of hexane and solvents represented by $C_nH_{2n+1}OH$ or $C_nH_{2n+2}CO$ (where n is 1, 2 or 3). A dopant may be used at the step of mixing.

13 Claims, No Drawings

PROCESS FOR PREPARING P-TYPE THERMOELECTRIC MATERIAL

BACKGROUND OF THE INVENTION

1) Field of the Invention

The present invention relates to a process for preparing a p-type thermoelectric material that is used as a material for thermoelectric devices utilizing Peltier effect or Seebeck effect.

2) Description of the Related Art

A thermoelectric device utilizing Peltier effect or Seebeck effect can be used in a variety of utilities such as elements for heating and cooling and for temperature control, thermoelectric electricity generators and the like.

The thermoelectric device is made from a thermoelectric material. Performance properties of the thermoelectric material are evaluated by the thermoelectric figure of merit Z that is obtained through the following equation, $$Z = \alpha^2/(\rho \cdot \kappa)$$

in which $Z[1/K]$ is figure of merit, $\alpha[\mu V/K]$ is Seebeck coefficient, $\kappa$ [mW/cm·K] is thermal conductivity, and $\rho$[mΩ·cm] is specific resistance.

If the figure of merit Z is higher, it means that the thermoelectric material has higher performance. To increase the figure of merit Z of the thermoelectric material, the Seebeck coefficient $\alpha$ may be increased and/or the specific resistance $\rho$ and the thermal conductivity $\kappa$ may be decreased.

Meanwhile, p-type and n-type thermoelectric materials obtained by adding a suitable dopant to an alloy containing at least two elements selected from the group consisting of bismuth (Bi), tellurium (Te), selenium (Se), antimony (Sb), and sulfur (S) are known to have higher figure of merit.

One of the methods for preparing this thermoelectric material is to mix and melt a powder obtained by weighing prescribed amounts of powders of Bi, Te, Se, Sb, S, and a prescribed amount of dopant, to obtain an alloy ingot, to grind the alloy ingot to obtain an alloy powder, and sinter the powder.

The sintering may be hot press sintering, normal pressure sintering, vacuum sintering, gas pressure sintering, plasma sintering, hot isostatic pressing (HIP) and the like. Inter alia, hot press sintering which hardly produces crack due to cleavage and affords a sintered material excellent in the mechanical strength is effective.

The figure of merit Z of a p-type thermoelectric material prepared by hot press sintering is around $3.0 \times 10^{-3} K^{-1}$. Generally, it is preferable that the figure of merit Z is high. For example, for use in an electric cooler or use in cooling a central processing unit (CPU) of a personal computer, a p-type thermoelectric material with the performance of $3.0 \times 10^{-3} K^{-1}$ may be used without practical problem.

However, a p-type thermoelectric material with the figure of merit Z of $3.0 \times 10^{-3} K^{-1}$ is not sufficient in many cases. These cases include an optical communication semiconductor laser requiring temperature control at a precision of 0.1° C. or lower in order to control an oscillation wavelength, use in an electric constant temperature bath necessary for temperature control of solution such as a photoresist solution, a plating solution and various surface treating solutions in a semiconductor manufacturing step, constant temperature control and temperature test for various materials and parts, and temperature control of a culture solution in gene or microorganism culturing, and use in precise temperature control in an ultraprecise air temperature and humidity controlling apparatus at a semiconductor manufacturing step. Thus, a p-type thermoelectric material with higher figure of merit Z is in demand.

However, it is difficult to obtain a p-type thermoelectric material having a higher figure of merit Z with the conventional process. Therefore, a process for manufacturing a p-type thermoelectric material with higher figure of merit Z is in demand.

SUMMARY OF THE INVENTION

It is an object of the present invention to at least solve the problems in the conventional technology.

The p-type thermoelectric material according to the present invention is prepared by mixing and melting at least two members selected from bismuth, tellurium, selenium, antimony, and sulfur to obtain an alloy ingot; grinding the alloy ingot to obtain powder of the allow mass; and hot pressing the powder. At least the hot pressing is carried out in the presence of any one of hexane and solvents represented by $C_nH_{2n+1}OH$ or $C_nH_{2n+2}CO$ (where n is 1, 2 or 3).

These and other objects, features and advantages of the present invention are specifically set forth in or will become apparent from the following detailed descriptions of the invention when read in conjunction with the accompanying drawings.

These and other objects, features and advantages of the present invention are specifically set forth in or will become apparent from the following detailed descriptions of the invention when read in conjunction with the accompanying drawings.

DETAILED DESCRIPTION

An exemplary embodiment of a process for preparing a p-type thermoelectric material of the present invention will be explained in detail below. In the present invention, as an element constituting a thermoelectric material, at least two elements are used from the group consisting of bismuth (Bi), tellurium (Te), selenium (Se), antimony (Sb), and sulfur (S).

In addition, for controlling and stabilizing the carrier density of a p-type thermoelectric material, a dopant may be used as necessary. Examples of such the dopant include Te and Se.

A prescribed amount of these elements constituting a thermoelectric material and, if necessary, a prescribed amount of dopant are weighed and mixed. This mixture is melted at a temperature higher than a melting point of raw materials under a non-oxidizing gas atmosphere such as argon gas or a mixed gas of argon gas and hydrogen gas. For example, when Sb is contained in raw materials, the raw material melts at a temperature range of 670° C. to 720° C. for 0.5 to two hours. After mixing in the melted state, cooling affords an alloy ingot.

The resulting alloy ingot is roughly ground in hexane, or a solvent represented by $C_nH_{2n+1}OH$ or $C_nH_{2n+2}CO$ (where n is 1, 2 or 3). Further, in a grinding method using a vibration mill or the like, mechanical grinding is performed in the presence of the solvent to obtain an alloy powder having an average particle size of 1 to 20 $\mu$m, preferably 1 to 10 $\mu$m.

Herein, the solvent represented by $C_nH_{2n+1}OH$ or $C_nH_{2n+2}CO$ (where n is 1, 2 or 3) includes methanol, ethanol, propanol, acetaldehyde, acetone and methyl ethyl ketone.

Thereafter, classification is performed with a stainless sieve in order that a powder is contacted with the air as little as possible while immersing the resulting ground powder in a solvent used for grinding, to separate course and fine powders, whereby, a particle size of the powder is adjusted.

An alloy powder having an adjusted particle size is subjected to hot press in the presence of the solvent. It is desirable that hot press is performed under the non-oxidizing gas atmosphere such as argon and a mixed gas of argon and hydrogen. In addition, it is desirable that, for hot press, a temperature is In a range of 500 to 600° C., a pressure is in a range of 20 to 40 MPa, and a time is 0.3 to 5 hours.

As explained above, by performing treatment from grinding of a melted alloy ingot to hot press in hexane, or a solvent represented by $C_nH_{2n+1}OH$ or $C_nH_{2n+2}CO$ (where n is 1, 2 or 3), adsorption of oxygen onto an alloy powder can be suppressed, and formation of a solid solution by oxygen diffusion onto a p-type thermoelectric material obtained by sintering can be prevented. As a result, since the carrier density in a p-type thermoelectric material becomes higher and a specific resistance becomes smaller, a p-type thermoelectric material having a higher figure of merit Z can be obtained.

A sintered material of the thus obtained p-type thermoelectric material is specifically a solid solution of bismuth telluride ($Bi_2Te_3$), bismuth selenide ($Bi_2Se_3$), antimony telluride ($Sb_2Te_3$), antimony selenide ($Sb_2Se_3$), bismuth sulfide ($Bi_2S_3$) and antimony sulfide ($Sb_2S_3$) or a combination of them.

These p-type thermoelectric materials are used as a thermoelectric device for performing cooling, heat generation or electricity generation by combining with n-type thermoelectric materials. And, this thermoelectric device is joined with a metal electrode into a thermoelectric module. This thermoelectric module is effective in utilities of electric power transforming recovery from exhaust heat of various heat engines and factories utilizing the Pertier effect, miniature generators, air conditioning systems having a simple structure, and refrigerators and, in particular, a thermoelectric module using a p-type thermoelectric material having a high figure of merit Z prepared by the process of the present invention is effective in use for solution temperature control at a step of manufacturing semiconductor lasers or semiconductors employed in optical communications, and electric constant temperature baths, and use for precise temperature control in an ultraprecise air temperature and humidity controlling apparatus at a semiconductor manufacturing step.

Concrete examples and comparative examples of the present invention will be specifically explained below.

Flakes of Te, Bi and Sb (all are high purity reagents having purity of 4N (99.99%)) were weighed at an alloy ratio of 20:80 (molar ratio) of bismuth telluride ($Bi_2Te_3$) and antimony telluride ($Sb_2Te_3$). These weighed materials were melted and mixed at 690° C. for one hour in a graphite crucible in the mixed gas atmosphere of an argon gas (99%) and a hydrogen gas (1%). Thereafter, the mixture was allowed to cool to around room temperature to obtain an alloy ingot having an end composition.

This alloy ingot was roughly ground in a solvent of n-hexane, ground with a vibration mill for 10 hours in n-hexane, and a ground powder was prepared with a sieve. Upon this, an average particle size of a ground powder was about 6 μm. Thereafter, the powder was subjected to hot press treatment at 530° C. for one hour under a pressure of 27 MPa in the presence of the solvent of n-hexane in the mixed gas atmosphere of an argon gas (97%) and a hydrogen gas (3%).

On the other hand, a sample of a comparative example was prepared by roughly grinding the alloy ingot having the composition which had been allowed to cool to around room temperature in a solvent of n-hexane as in the example, grinding the powder with a vibration mill for 10 hours in n-hexane, and subjecting the ground powder to a sieve. Thereafter, the ground powder was dried with a dryer, and subjected to hot press treatment at 530° C. for one hour under a pressure of 27 MPa without using a solvent, in the mixed gas atmosphere of an argon gas (97%) and a hydrogen gas (3%).

A sintered sample of the thus obtained p-type thermoelectric material was processed into an arbitrary shape, and measurement of oxygen concentration, specific resistance, Seebeck coefficient, power factor, carrier density, and thermal conductivity, and the figure of merit was calculated. The results are shown in Table 1. In addition, the oxygen concentration in Table 1 was obtained by weighing a prescribed amount of sample in a Ni capsule, melting a sample in a carbon crucible under a helium gas stream, passing an oxygen gas released from the sample at melting through a carbon catalyst layer to convert into carbon monoxide, and measuring an amount of the carbon monoxide by an infrared-ray absorbing method.

TABLE 1

| | Average particle diameter [μm] | Oxygen Concentration [wt %] | Specific resistance [mΩ cm] | Seebeck coefficient [μV/K] | Power factor [×10⁻³ mW/ cmK²] | Carrier density [×10¹⁹/ cm³] | Thermal Conductivity [mW/cm K] | Figure of merit [×10⁻³/K] |
|---|---|---|---|---|---|---|---|---|
| Example | 5.67 | 0.053 | 0.910 | 202.7 | 45.2 | 2.45 | 12.7 | 3.56 |
| Comparative example | 6.43 | 0.16 | 1.241 | 217.9 | 38.3 | 2.18 | 12.8 | 2.99 |

As shown in Table 1, the p-type thermoelectric material prepared by a process of the comparative example has a small average particle size of 6.43 μm and has a higher concentration of oxygen adsorbed onto an alloy powder and, therefore, has a lowered carrier density. For that reason, a specific resistance becomes higher, and a power factor ($α^2/ρ$) in inverse proportion to a specific resistance becomes lower. As a result, the figure of merit Z is around $2.99 \times 10^{-3} K^{-1}$.

On the contrary, the p-type thermoelectric material prepared by the process of the example has an increased carrier density although the material has a smaller average particle size (5.67 μm) than that of the comparative example (6.43 μm), because the material was treated in a solvent of n-hexane and, therefore, the concentration of oxygen adsorbed onto an alloy powder could be suppressed low. Therefore, the specific resistance becomes lower and a power factor becomes higher and, as a result, the figure of merit Z becomes as high as $3.56 \times 10^{-3} K^{-1}$. That is, contact of an alloy powder and oxygen in the air at a preparing step can be avoided by the process of the present invention of performing grinding and hot press in a solvent, a figure of merit Z is improved by about 19% as compared with the first. The comparative example is obtained by the previous process using no solvent. In addition, a figure of merit has a difference in the cooling ability of around 1.5° C. by a difference of 0.1 $(\times 10^{-3} K^{-1})$.

In addition, also by other solvents $C_nH_{2n+1}OH$ or $C_nH_{2n+2}CO$ (where n is 1, 2 or 3), the figure of merit Z was improved similarly. Further, also when an alloy having a composition other than $(Bi_2Te_3)_{20}(Sb_2Te_3)_{80}$ was ground and hot pressed in a solvent of hexane, $C_nH_{2n+1}OH$ or $C_nH_{2n+2}CO$ (where n is 1, 2 or 3), the figure of merit Z was improved.

As explained above, in the present invention, since grinding and hot press are performed in the presence of a solvent such as hexane, $C_nH_{2n+1}OH$ or $C_nH_{2n+2}CO$ (where n is 1, 2 or 3) in a process for preparing a p-type thermoelectric material, a carrier density is increased by suppression of adsorption of oxygen onto a material and conversion into a solid solution and as a result, a p-type thermoelectric material having a better figure of merit can be obtained. And, since the p-type thermoelectric material obtained by the present process has a high figure of merit, it can be applied to the fields requiring more precise temperature control by utilizing the Peltier effect as a thermoelectric device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A process for preparing a p-type thermoelectric material, comprising:

mixing and melting at least two members selected from bismuth, tellurium, selenium, antimony, and sulfur to obtain an alloy ingot;

grinding the alloy ingot to obtain powder of the allow mass; and hot pressing the powder, wherein at least the hot pressing is carried out in the presence of hexane.

2. The process according to claim 1, wherein the hot pressing is performed under a non-oxidizing gas atmosphere.

3. The process according to claim 1, wherein an average particle size of the powder is 1 to 20 μm.

4. The process according to claim 1, wherein a dopant is us at the mixing.

5. The process according to claim 1, wherein the grinding is carried out in the presence of a solvent represented by $C_nH_{2n+1}OH$ or $C_nH_{2n+2}CO$ (where n is 1, 2 or 3), which comprises at least one of methanol, ethanol, propanol, acetoaldehyde, acetone and methyl ethyl ketone.

6. The process according to claim 2, wherein the non-oxidizing gas is any one of argon and a mixed gas of argon and hydrogen.

7. The process according to claim 1, wherein the grinding is carried out in the presence of hexane.

8. A process for preparing a p-type thermoelectric material, comprising:

mixing and melting at least two members selected from bismuth, tellurium, selenium, antimony, and sulfur to obtain an alloy ingot;

grinding the alloy ingot to obtain powder of the allow mass; and hot pressing the powder, wherein at least the grinding is carried out in the presence of hexane.

9. The process according to claim 8, wherein the hot pressing is performed under a non-oxidizing gas atmosphere.

10. The process according to claim 8, wherein an average particle size of the powder is 1 to 20 μm.

11. The process according to claim 8, wherein a dopant is used at the mixing.

12. The process according to claim 8, wherein the hot pressing is carried out in the presence of a solvent represented by $C_nH_{2n+1}OH$ or $C_nH_{2n+2}CO$ (where n is 1, 2 or 3), which comprise one or more of methanol, ethanol, propanol, acetoaldehyde, a tone and methyl ethyl ketone.

13. The process according to claim 9, wherein the non-oxidizing gas is any one of argon and a mixed gas of argon and hydrogen.

* * * * *